United States Patent [19]

Liu et al.

[11] Patent Number: 4,988,412
[45] Date of Patent: Jan. 29, 1991

[54] SELECTIVE ELECTROLYTIC DESPOSITION ON CONDUCTIVE AND NON-CONDUCTIVE SUBSTRATES

[75] Inventors: Yung S. Liu, Schenectady; Herbert S. Cole, Scotia; Renato Guida, Wynantskill; James W. Rose, Delmar, all of N.Y.

[73] Assignee: General Electric Company, Schenectady, N.Y.

[21] Appl. No.: 289,944

[22] Filed: Dec. 27, 1988

[51] Int. Cl.⁵ ............................................. C25D 5/02
[52] U.S. Cl. .................................................... 204/15
[58] Field of Search ........................................ 204/15

[56] References Cited

U.S. PATENT DOCUMENTS

| | | | |
|---|---|---|---|
| 1,862,231 | 6/1932 | McFarland | 204/18.1 |
| 3,388,048 | 6/1968 | Szabo | 204/15 |
| 3,507,756 | 4/1970 | Wenger | 204/15 |
| 3,809,625 | 5/1974 | Brown | 204/15 |
| 4,783,695 | 11/1988 | Eichelberger et al. | 357/65 |

*Primary Examiner*—T. M. Tufariello
*Attorney, Agent, or Firm*—Robert Ochis; James C. Davis, Jr.; Marvin Snyder

[57] ABSTRACT

Selective electrolytic deposition is provided on a body having a conductive surface comprised of two different conductive materials in which one of the conductive materials forms a surface layer upon exposure to a particular ambient environment and wherein that surface layer prevents electroplating on that material in the particular electroplating environment utilized for the electroplating of the desired pattern on the other conductive material.

9 Claims, 20 Drawing Sheets

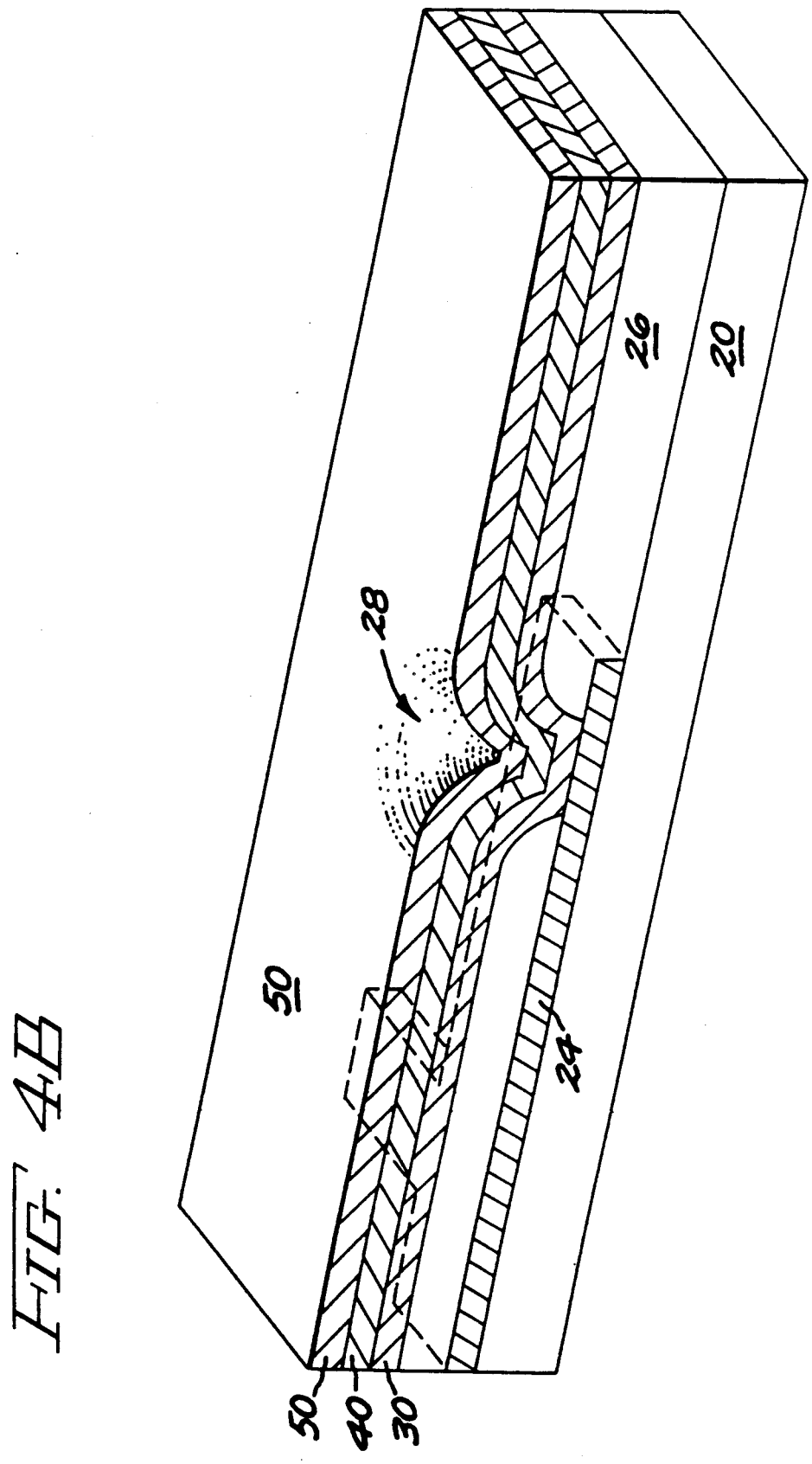

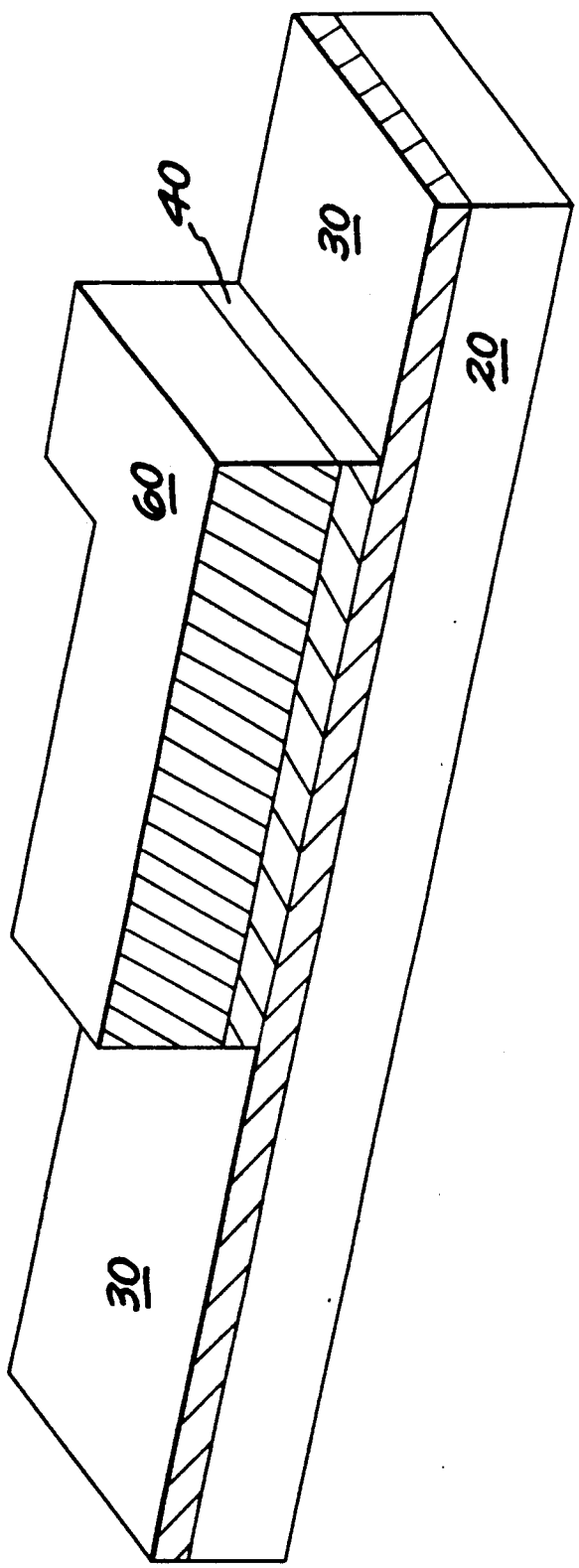

SELECTIVE ELECTROLYTIC DESPOSITION ON CONDUCTIVE AND NON-CONDUCTIVE SUBSTRATES

The government has rights in this invention pursuant to Contract No. N00014-85-C-0890 awarded by the Department of the Navy.

FIELD OF THE INVENTION

The present invention relates to the fields of electroplating and microelectronic conductor formation, and more particularly, to selective formation of thick conductor patterns on microelectronic structures.

BACKGROUND INFORMATION

Electrolytic metal deposition is a widely used industrial process having application to a wide variety of products and fields. In electronic applications where a specific metal pattern is required, electrolytic deposition may be used in either of two manners. In the first, a uniform metal layer is formed by electrolytic deposition, the exposed surface of that layer is coated with a photoresist, the photoresist is then exposed in the desired pattern for the final metal structure, the photoresist is developed and the structure is etched to remove the unprotected electroplated material In the second technique, a photoresist pattern is disposed on the conductive surface of a substrate structure, exposed and developed to expose the underlying conductive layer in the desired plating pattern. Thereafter, the structure is electroplated to produce a thick layer on the exposed portion of the underlying conductive layer. Where relatively thick conductive layers are desired, these processes both present problems with respect to the durability of the photoresist in the etching or plating bath because extended time periods in these solutions can cause deterioration of the photoresist. Sufficient deterioration of the photoresist results in plating or etching in undesired locations. Another technique for plating which can be used for a connected structure is to define the conductor to be plated with photoresist and remove the rest of the layer. This process depends on carrying the plating current through the structure being plated itself This tends to result in non-uniform plating with the greater thickness being near the external electrical connections to the structure and successively lesser thicknesses further from the connections. Thus, this is not a preferred method. An additional problem where fine line, thick metallic patterns are desired is the inability of both the plating-followed-by-photoresist-and-etching and the photoresist-followed-by-plating process to provide reliable definition of fine line structures. Another problem with the plating followed by photoresist and etching process is the problem of accurately aligning the photoresist exposure mask with respect to the underlying structure on the substrate beneath a thick metal layer.

There is a need for a process which enables thick, patterned layers of metal to be electrolytically deposited on a conductive substrate in a reliable manner with a minimum of processing steps.

OBJECTS OF THE INVENTION

Accordingly, a primary object of the present invention is to provide a process for electroplating a conductive substrate in a selective pattern.

A further object of the present invention is to electroplate a metal pattern using a process where photoresist adherence is not a limiting factor either on the size of pattern details or the thickness of the layer to be plated.

A still further object of the present invention is to plate a structure having a conductive surface in a selective manner on that conductive surface.

SUMMARY OF THE INVENTION

The above and other objects which will become apparent hereinafter are accomplished in accordance with the present invention by providing a substrate to be plated with a conductive structure having a conductive external surface comprised of two different metals and electroplating the body in a manner in which electroplating takes place on only one of the two metals. The metal on which electroplating takes place may preferably be copper, nickel, gold, alloys containing copper, nickel or gold and mixtures thereof. The metal on which plating does not take place may preferably be titanium, chromium, aluminum, alloys containing chromium, aluminum or titanium and mixtures thereof. Both of these groupings include other conductive materials in accordance with the invention with the grouping of particular metals being dependent on the metal to be deposited by electroplating.

The conductive surface of the body which comprises two different conductive materials may be formed in a wide variety of ways including, but not limited to, forming a first continuous layer of one conductive material and a second continuous layer of a second conductive material on the first conductive material Thereafter, the second conductive material may be selectively removed to expose the first conductive material, either the first or second conductive material may be the one on which plating takes place with the other being the one on which plating does not take place. Alternatively, a first continuous layer of conductive material may be formed over the substrate and a second conductive material may be selectively deposited on the first conductive material. Again, either the first or second conductive material may be the one on which plating takes place with the other material being one on which plating does not take place.

DESCRIPTION OF THE FIGURES

The subject matter which is regarded as the invention is particularly pointed out and distinctly claimed in the concluding portion of the specification. The invention, however, both as to organization and method of practice together with further objects and advantages thereof, may best be understood by reference to the following description taken in connection with the accompanying drawings in which

FIGS. 4A-4E illustrate successive steps in one embodiment of the present invention;

FIGS. 6A-6E illustrate successive steps in a further alternative embodiment of the present invention;

DETAILED DESCRIPTION

Figure 1:
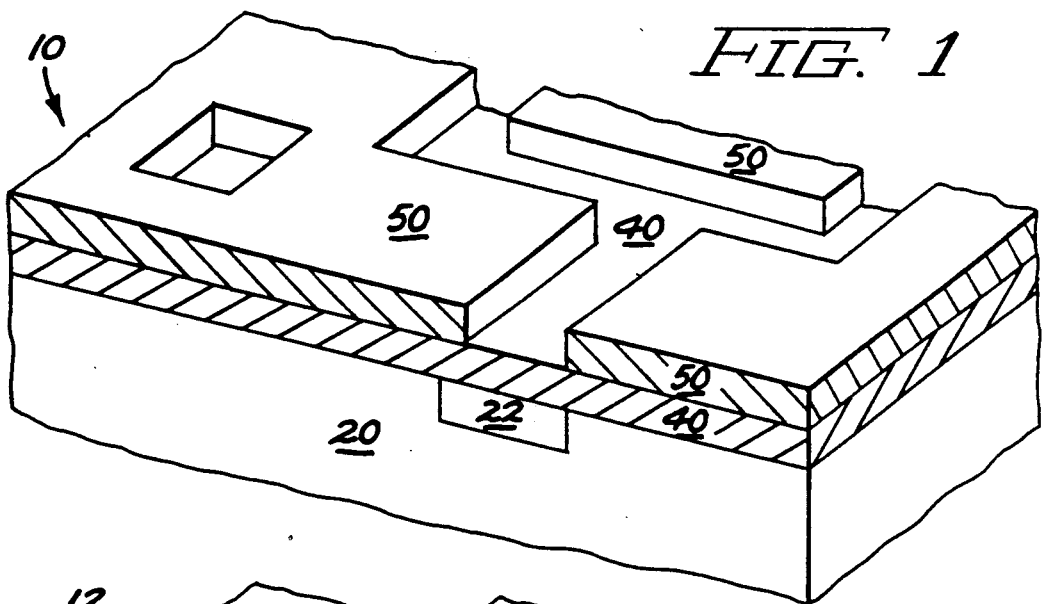
FIGS. 1-3 are perspective illustrations of bodies in accordance with the present invention ready for electrodeposition, each of these figures illustrates a different conductive structure on the substrate to be plated.

This invention involves providing a substrate with a conductive surface comprised of two different conductive materials which have different electroplating properties. In particular, the conductive material on which electroplating does not take place is protected (insulated) from the plating bath by a surface layer such as a native oxide of that conductive material. This is a widely applicable method of selective electro-deposition in a patterned manner controlled by the conductive materials which comprise the surface of a body to be electroplated. The term surface in the preceding sentence obviously includes those situations where upon micro analysis, the outer layer of the body in the non-platable areas is in fact a compound of the conductive material FIG. 1 is a perspective, cross-section view of a substrate 20 which has been prepared for selective electrolytic deposition in accordance with the present invention. The substrate 20 has a first, continuous layer 40 of metal disposed on its upper surface. A second patterned layer 50 of metal is disposed on the upper surface of the first metal layer 40. The metal of layer 50 has a different composition than the metal of layer 40. The composition of the layer 40 may be particularly selected for providing good adherence to both the substrate 20 and the second metal layer 50. The second layer 50 is patterned to expose the first layer 40 thereunder in the desired plating pattern.

The substrate 20 may be any desired substrate including an insulating body such as a ceramic or glass substrate or a microelectronic structure such as an integrated circuit or a conductive body such as a metal. The substrate itself may be conductive and may comprise either the metal on which plating takes place or the metal on which plating does not take place In that situation, only a layer of a metal of the other type needs to be deposited on the "substrate" in carrying out our inventive process. The details of the structure and composition of the substrate 20 are essentially immaterial to the process of the present invention so long as the layer 40 strongly adheres at least to those portions on which the plated conductor is to be disposed. In FIG. 1, a conductive contact portion 22 of the substrate 20 is illustrated beneath and in alignment with the plating pattern as defined in the second metal layer 50.

In accordance with the present invention, the layer 40 may be directly disposed on the substrate 20 or may have intervening layers between it and the substrate 20. The metal of the layer 40 is preferably a first metal which does not form a surface layer which protects that metal from electroplating when it is exposed to oxygen or another external reactant. The metal of the layer 50 is a second metal which preferably forms a surface film when it is exposed to air or another external environment That surface film being one which protects the second metal from electroplating. Metals suitable for use as the first metal depend on the composition of the plating bath and when the metal to be electroplated from that bath is copper include copper, nickel and gold, alloys containing copper, nickel or gold and mixtures thereof. Other metals and alloys may also be used so long as they do not form a surface film (during the process of the invention) which prevents plating. Metals suitable for use as the second metal when the metal to be plated onto the body is copper, include titanium, chromium, aluminum, alloys containing titanium, chromium or aluminum and mixtures thereof. Alternatively, other metals may be used as the layer 50 provided they form a surface film which prevents plating when exposed to an ambient environment (which may be gaseous, liquid or even a solid) in which the metal of the layer 40 does not form a non-platable surface film. When the metal to be plated is gold or nickel, the first metal may be copper, nickel, gold or titanium, alloys thereof or mixtures, while the second metal is preferably aluminum. Similarly, the layer 40 may be any conductive material which does not form a surface insulating film which survives the plating process In this specification, a layer which prevents plating may be referred to as a "non-platable" layer or film or a "non-plating" layer or film. By a non-platable film or layer, we mean one which under the conditions of the process being carried out, prevents plating in that location to thereby provide plating selectively. Thus, what is a non-platable film under one set of process conditions may not be a non-platable film under a different set of process conditions. Further, a metal can change between being platable and being non-platable for the same bath by forming a different surface layer thereon. In general, we prefer that the non-platable film be a native compound because of the intimate bond between the compound and the underlying metal which results and because its formation by its nature self-aligns that film with the underlying metal layer when the film is formed after patterning. By native, we mean a compound of the metal where the atoms of that metal which are present in the compound are derived from the metal layer during the reaction which creates the compound, as opposed to deposition of the compound onto the surface of the metal. While the protective layer is preferably a compound of the underlying metal, benefits are also obtained by sputtering an insulating layer such as $SiO_2$ onto the surface of the metal.

The body 10 with the layers 40 and 50 thereon is immersed in an electrolytic plating bath to plate a metal such as copper, gold or nickel on the exposed surface of the first metal of layer 40. The continuous layer 40 serves as a ground plane for the electroplating process. Where the metal 40 is copper and the metal 50 is titanium we prefer to clean the body 10 in Neutra-Clean ™ available from Shipley, Inc. This is a widely used cleaning solution for use prior to copper electroplating. We then prefer to attach the cathode of the electrolytic plating system to the body 10, and particularly, to the conductive layers 40 and 50 prior to immersion of the body 10 in the electrolytic plating bath. A plating polarity of voltage is preferably applied to this electrode prior to immersion of the body 10 in the plating bath. Under these conditions, the copper electroplates on all exposed portions of the layer 40 and nowhere on the titanium layer 50. If the body 10 is immersed in this plating bath prior to application of a plating polarity of volt age to the body 10, we have found that copper speckling occurs on the titanium portions of the body. This is believed to be a result of the plating bath removing a surface oxide from the titanium at random locations on the titanium portion of the exposed surface.

Using this technique, we have successfully plated copper conductors to a thickness of 12 microns although the copper plating can be made thicker if desired. We have plated conductors as narrow as 6 microns to a depth of 5 microns while retaining accurate definition of the initially defined plating pattern. Following the electroplating of the thick copper layer, the body 10 is immersed in a dilute HF solution to selectively etch the titanium without affecting the copper. Thereafter, a brief copper etch of about 10-20 seconds in a ferric chloride copper etching bath removes the layer 40 except where it is protected by the electroplated layer. This results in a well-defined pattern of conductors disposed on the surface of the substrate 20 interconnecting those portions of the substrate 20 it is desired to interconnect, while leaving other portions free of conductive material.

This process is a great advance over prior art photoresist processes because so far as our tests reveal, the surface layer on the titanium is not attacked by the plating solution with the result that any desired depth of plated copper may be provided Fine pattern resolution can be obtained, since the pattern for the plating is defined in a thin (500-1000 angstrom) titanium layer which can be rapidly etched to expose the copper.

This selective plating on only one of two different conducting materials which are electrically connected and immersed in a plating bath is contrary to normal expectations since those skilled in the art would predict plating on both metals.

It will be understood in each of the figures, that only a small portion of a substrate and its overlying layers are illustrated. The actual pattern of a production structure is determined by the details of the device or system being produced.

Figure 2:
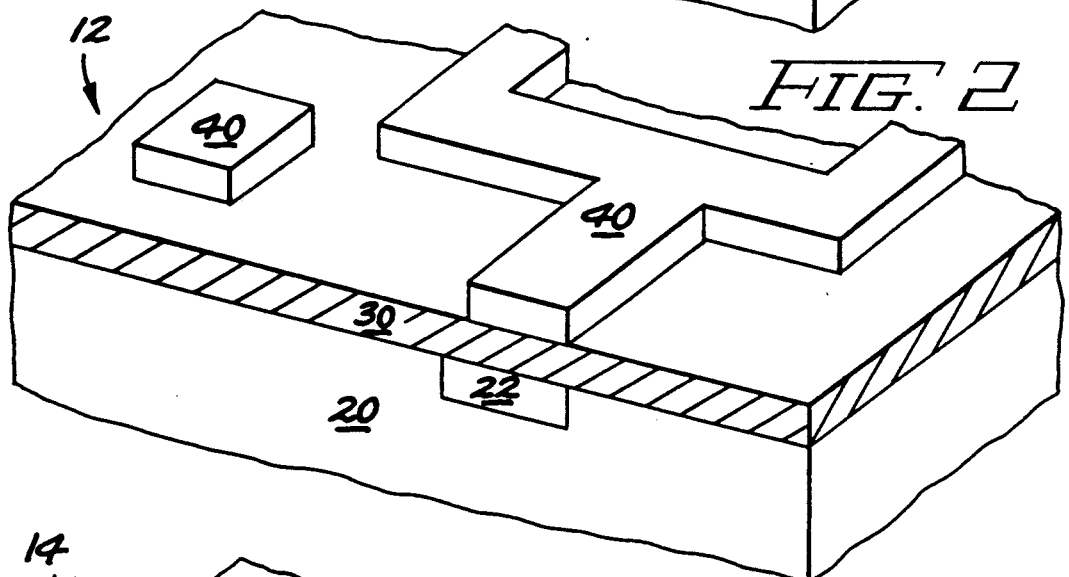

FIG. 2 is perspective illustration of the substrate 20 prepared for plating in accordance with an alternative embodiment of the present invention. In FIG. 2, the substrate 20 has a continuous layer 30 of conductive material disposed on its upper surface The layer 30 has a patterned layer 40 of a second metal disposed on its upper surface. The layer 40 is patterned in accordance with the desired plating pattern and is only present where plating is desired. For copper electroplating, the layer 30 may preferably be titanium, while the layer 40 may preferably be copper. The resulting body 12 is plated in the same manner as the body 10 of FIG. 1. After plating, a selective titanium etch, dilute HF, removes the conductive connection between the isolated segments of the plated metal pattern and thereby leaves isolated conductor segments interconnecting desired locations on the substrate 20. For many applications, the structure of FIG. 2 is preferred over the structure of FIG. 1 because titanium provides a better adherence to many substrates than copper does.

DETAILED EXAMPLE TM 1

A conducting film was prepared by sputtering 1,000 Å of titanium followed by 3,000 Å of copper on a precleaned 2×2 inch glass substrate. A variable resolution pattern was then formed in the copper layer using a positive photoresist (KTI 1471). The resist was coated, exposed, and developed using the manufacturer's recommended procedures. The copper layer was etched using a dilute ferric chloride solution to yield the desired pattern in the copper layer. After removal of the resist layer, the part was ready for electrolytic copper deposition.

The sample was cleaned in Neutra-Clean (a product of Shipley Corporation) by immersing for 1 minute with slight agitation. The parts were then rinsed in deionized (D.I.) water for 30 seconds with agitation. The part was then clamped in a holder; electrically connected to the cathode and immersed in the electrolytic copper bath. This copper bath consisted of a water solution of 125 g/L of copper (II) sulfate-pentahydrate, 60 g/L sulfuric acid and 50 ppm hydrochloric acid, all obtained in reagent grade from Ashland Chemical and was held at room temperature. This bath was filtered constantly, agitated mechanically and with air and had an anode-to-cathode area ratio of 2:1. The part was electroplated for 5 minutes at a plating current density of 30 amps/square foot. Lines of 6 micron width and 3-5 micron thickness were produced using this process. The thin residual titanium was etched in dilute HF.

DETAILED EXAMPLE 2

A conducting film was prepared by sputtering 1,000 Å of chromium followed by 3,000 Å of copper on a precleaned 2×2 inch glass substrate. The detailed process of Example 1 was used to pattern and plate the copper selectively on the copper and not on the chromium. Similar results were obtained as in Example 1.

DETAILED EXAMPLE 3

A conducting film of titanium was sputtered 1,000 Å thick followed by a 1,000 Å thick layer of sputtered gold. The gold layer was patterned using the photoresist in Example 1 and C-35 conductor etchant from Film Microelectronics, Inc. and was then immersed in a copper electroplating bath to selectively plate copper. The copper plated only on the gold.

Figure 3:
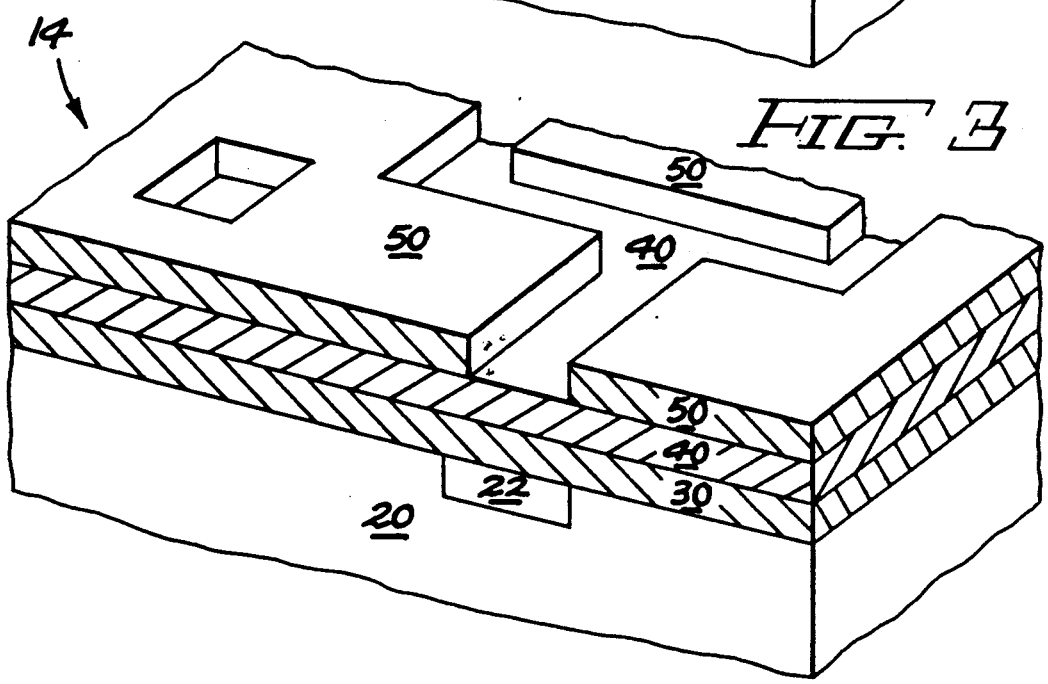

A further alternative structure for plating is shown in perspective view in FIG. 3. In FIG. 3, the substrate 20 has a first layer 30 of titanium disposed on its upper surface. A second continuous layer 40 of copper is disposed on the upper surface of the titanium layer 30 and a third patterned layer 50 of titanium is disposed on the upper surface of the copper layer 40. This resulting body 14 may be plated in the same manner as the bodies 10 and 12. Following plating, a selective titanium etch (dilute HF) removes the layer 50. Thereafter, a brief copper etch removes the layer 40 except under the electroplated material and a second selective titanium etch removes the titanium of the layer 30 except under the retained portions of the layer 40 where the electroplated material is disposed on the layer 40. While the layers 30 and 50 are preferably titanium and the layer 40 is preferably copper for electroplating, it will be understood that the layers 40 and 50 may be any two metals so long as the metal 40 does not form a non-platable surface film and the layer 50 does form a non-platable surface film in the presence of an ambient environment to which the body 14 is exposed prior to plating, provided that a plating solution is utilized in which the surface film on the layer 50 is not attacked.

In accordance with common practice in the semiconductor arts, the layer 40 may preferably be copper, nickel or gold while the layer 50 may preferably be titanium, aluminum, or chromium. These are all materials which are used in the semiconductor arts, and thus do not present contamination problems. Aluminum, chromium and titanium all form oxide surface layers when exposed to air. This is considered the simplest embodiment of the present invention because it does not require a separate process step to form the non-platable surface layer. However, other materials which will form a non-platable surface layer with air or other ambient environments may be used along with other metals 40 which do not form a non-platable surface layer in the ambient environment employed. As a further alternative, a metal 40 may be used which forms a surface layer in that environment so long as it is removed either before insertion in the plating bath or in the plating bath in a manner which results in plating on the entire "exposed" surface of the metal 40. Naturally, the non-platable surface layer must survive this removal process. Multiple step surface layer formation processes may be utilized as may be desirable, i.e. forming surface layers on both metals in one ambient environment and then converting one or both of those surface layers to other compositions in another ambient environment until a non-platable layer is present on the second metal and the first metal is platable.

Figure 4A:
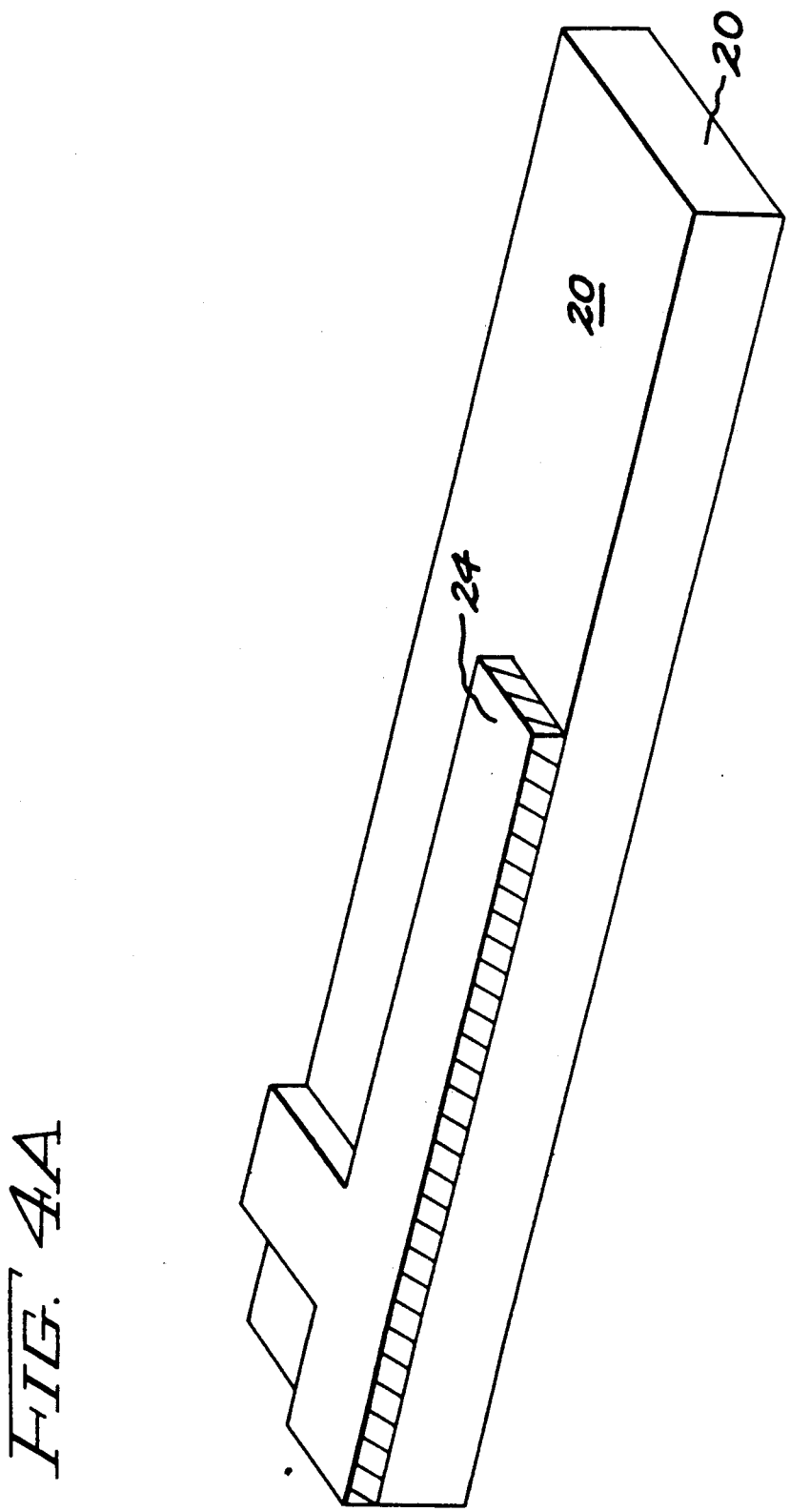

The non-platable surface layer may be one which forms on the second metal without a non-platable layer forming on the first metal. Alternatively, non-platable layers may form on both metals, with the layer on the first metal being one which a particular process or bath will remove or convert to a platable layer without removing the layer on the second metal and without converting that layer to a platable one. Alternatively, a non-platable layer may be formed on the entire surface and that layer may then be selectively removed to render the portion of the body from which it is removed platable FIG. 4A is a perspective cross-sectional illustration of a substrate 20 having a conductor 24 disposed on the upper surface thereof as part of that substrate. In FIG. 4B, a Kapton ™ polyimide layer 26 as sold by E.I. Dupont du Nemours Company was laminated onto the upper surface of the substrate 20 as an insulating layer. This lamination may be done in any of a number of ways, but is preferably done in accordance with U.S. Pat. No. 4,783,695 issued Nov. 28, 1988, invented by C.W. Eichelberger and R.J. Wojnarowski, entitled "Multichip Integrated Circuit Packaging Configuration and Method" and assigned to the present assignee. This patent is incorporated herein by reference. The polyimide layer 26 has a via hole 28 therethrough in alignment with a portion of the conductor 24. The structure comprised of substrate 20 and Kapton layer 26 may be viewed as the substrate on which the plating is desired. Thus, the use of the term substrate for the member on which the Kapton is disposed is not to be taken as limiting the breadth of meaning afforded the very general term "substrate" as it is used in the claims. On top of the Kapton layer in FIG. 4B is a three layer conductive structure comprised of a titanium film 30 which was sputtered directly onto the Kapton and the exposed portion of the conductor 24. This initial titanium layer is preferably on the order of 500-1000 angstroms thick. A copper layer 40 of 500-1000 angstroms thick was sputtered directly over the initial titanium layer without breaking the vacuum in the sputtering system. It is preferred to avoid breaking the vacuum in the sputtering system between the initial titanium deposition and the copper deposition because we have found that the presence of an oxide layer on the titanium drastically reduces the peel strength of the copper layer as compared to a copper layer disposed directly on elemental titanium. A second titanium layer 50 was sputtered over the copper layer and is also on the order of 500-1000 angstroms thick. With each of these three layers, the thickness is limited at the lower end by the need to prevent pinholes. At the present time, sputtering normally requires a thickness of about 500 angstroms in order to produce a pinhole-free layer. In the event that in the future, some refinement in the sputtering process or some other process is developed which provides a pinhole-free layer which is substantially thinner, then these layers may be made thinner. The upper limit of about 1,000 angstroms is one of design choice and is not a physical limitation. It is preferred to keep these layers relatively thin because thicker layers are not needed and thus sputtering time can be minimized and, when layers are patterned using photoresist and etching, better resolution is obtained with thinner layers.

The structure shown in FIG. 4B was next overcoated with a photoresist layer, either a positive or negative photoresist may be used. That photoresist layer was then exposed in a pattern, which after development, left the upper titanium layer exposed in the desired plating pattern. A selective titanium etch (dilute HF) was then used to remove the exposed portions of the upper titanium layer. The remaining photoresist was then removed. The result is the structure shown in FIG. 4C.

Figure 4C:
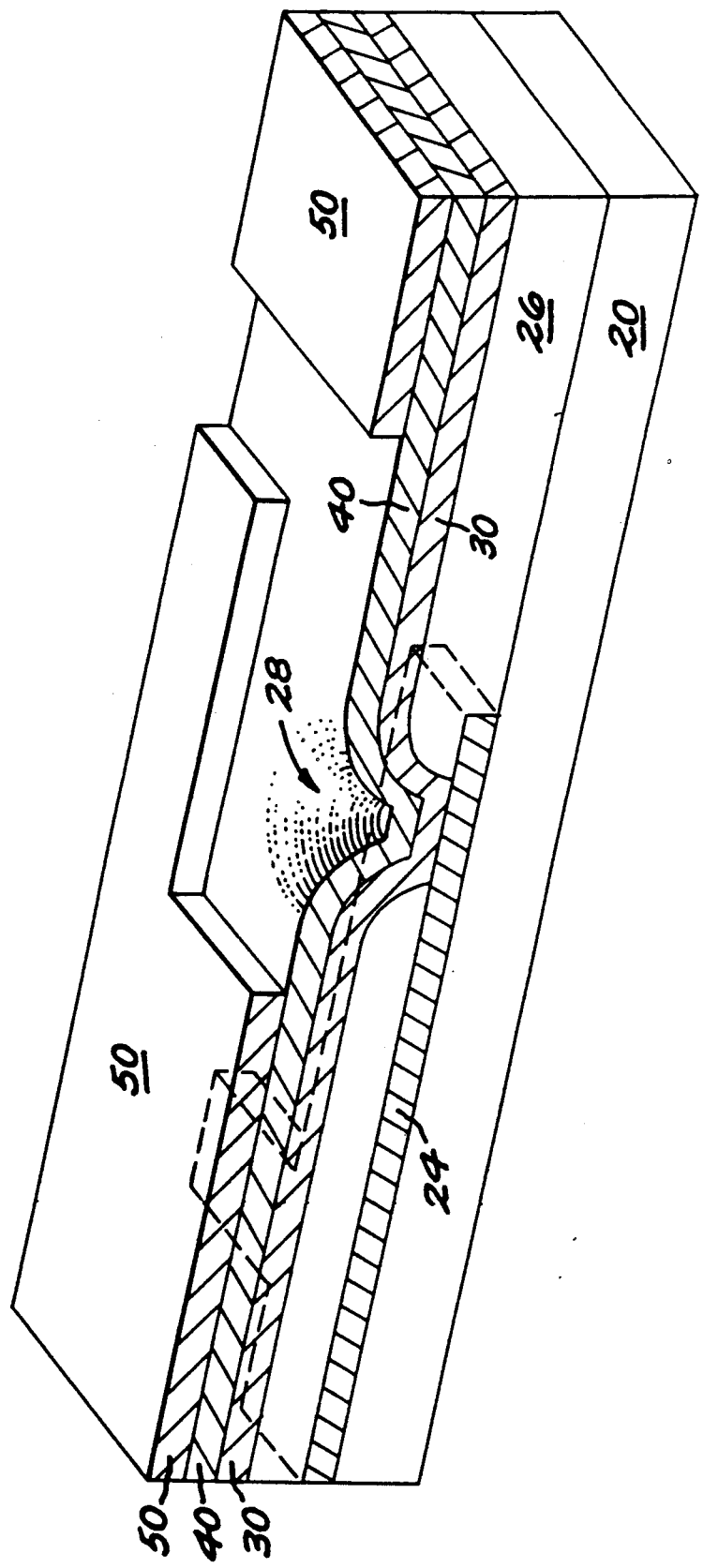
Figure 4D:
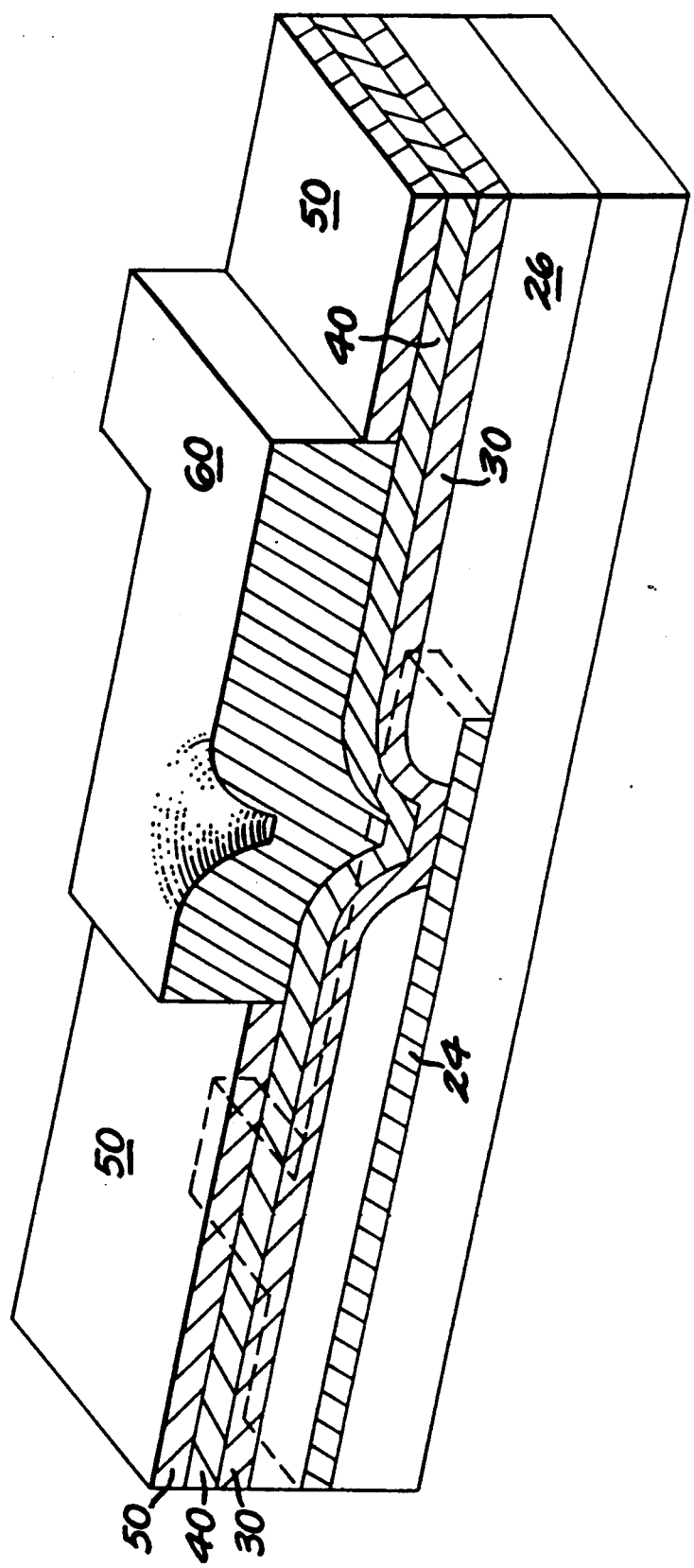
Figure 4E:
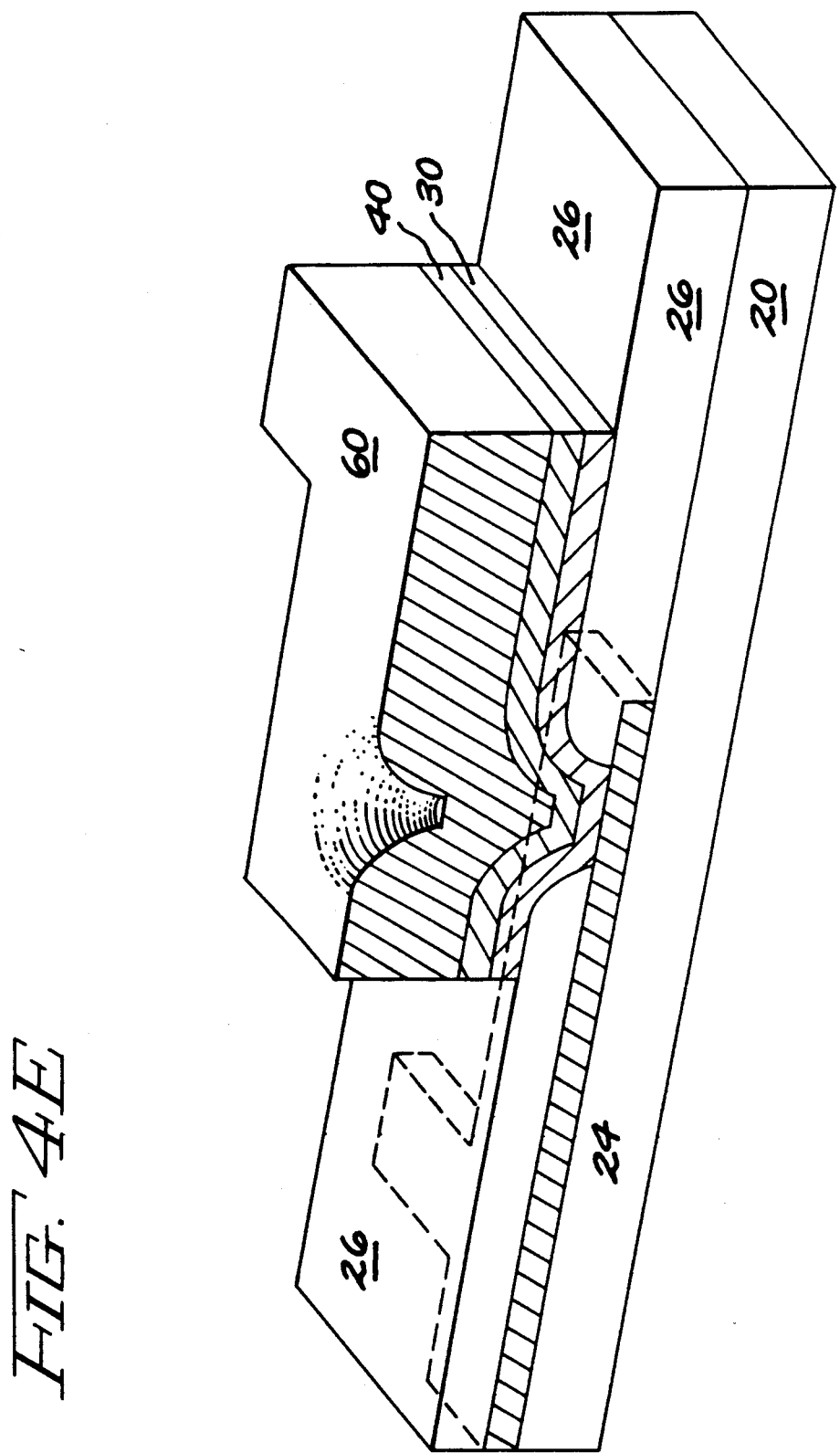

Next, the structure shown in FIG. 4C was electroplated in the manner which has been described above to produce a thick copper layer 60 on top of the exposed portions of the uniform copper layer 40. This resulted in the structure illustrated in FIG. 4D. Thereafter, in succession, the structure was etched in a selective titanium etch (dilute HF) to remove the layer 50, etched briefly in a copper etch (ferric chloride) to remove the portions of the uniform copper layer 40 which were not protected by the thick electroplated copper layer 60 and then etched again in a selective titanium etch to remove the lower layer 30 of titanium except where it was protected by the electroplated copper. The resulting structure is illustrate in FIG. 4E.

This three layer titanium/copper/titanium initial structure provides the benefits of providing good adhesion between the copper and the polyimide film since titanium adheres to both. Simultaneously, it provides the benefit for plating patterns in which the area-to-be-plated is less than 50% of only requiring that the upper titanium layer be removed in the desired plating pattern As an alternative to the use of photoresist and a wet selective titanium etch, the structure as shown in FIG. 4B can be placed in a halogen gas atmosphere and the titanium layer exposed using a laser in the desired plating pattern Under these conditions, the halogen gas reacts with the titanium where the titanium is exposed to the laser. This selectively etches the titanium from the surface of the body shown in FIG. 4B. Careful control of the time of exposure ensures that all of the titanium is removed from the exposed areas with little or no etching of the underlying copper layer. Once the structure shown in FIG. 4C is produced by this method, the remaining part of the process continues as described just above for wet selective etching of the titanium film using photoresist.

Figure 5A:
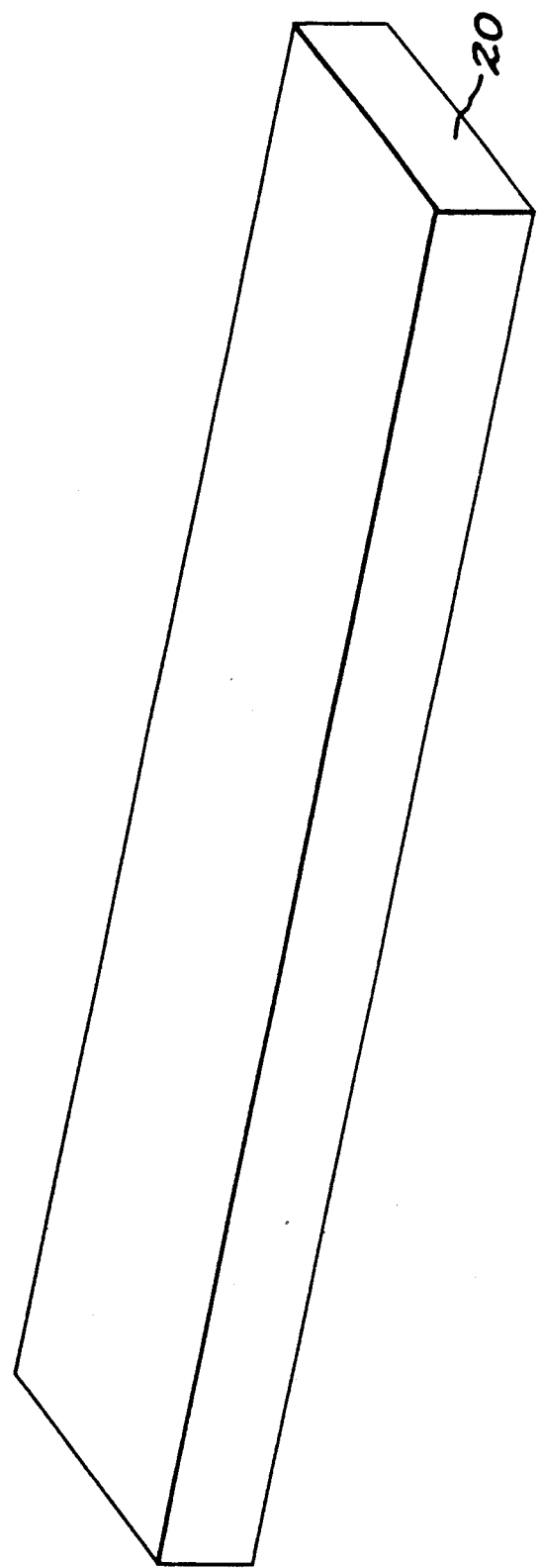
FIGS. 5A-5E illustrate successive steps in an alternative embodiment of the present invention.
Figure 5B:
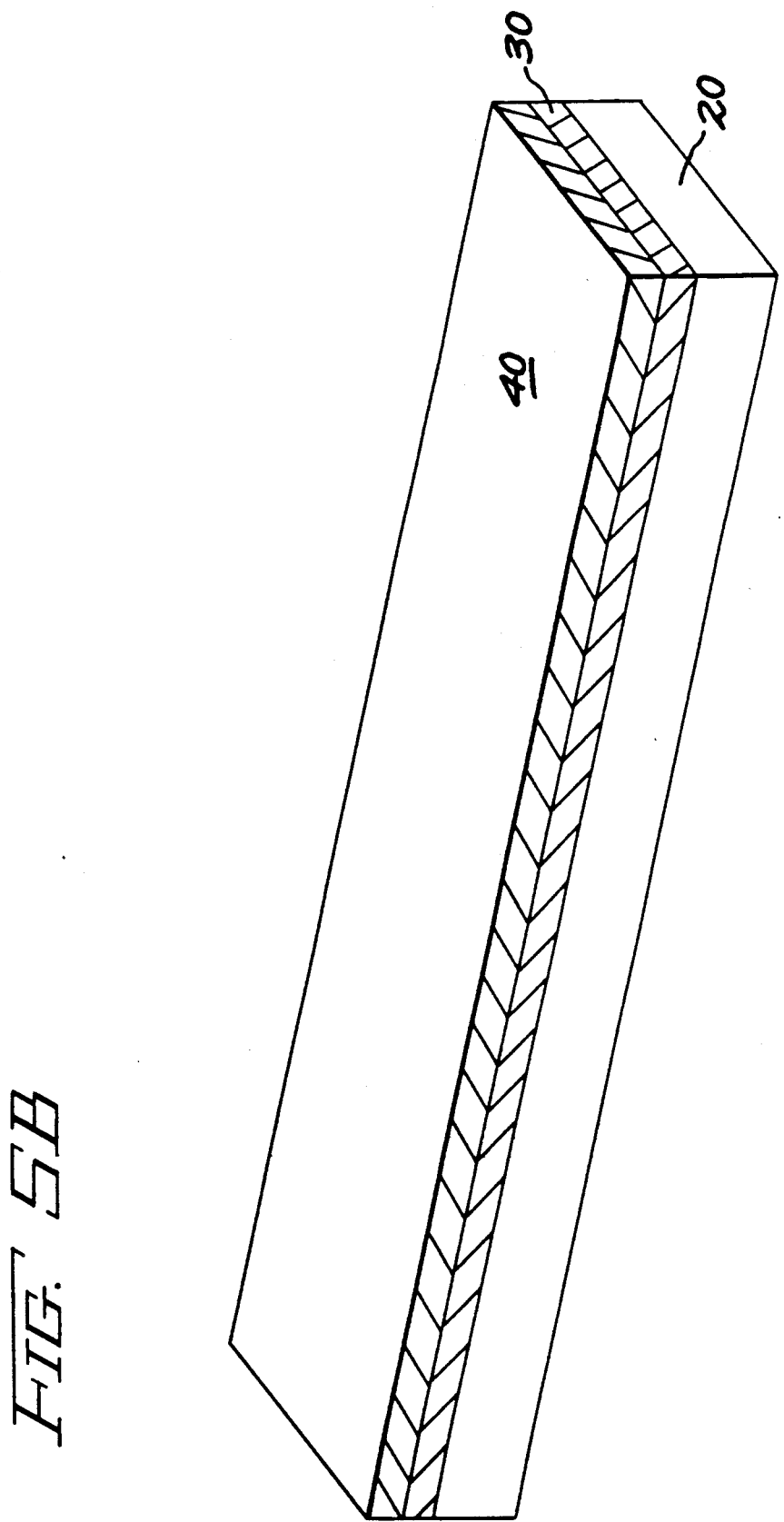
Figure 5C:
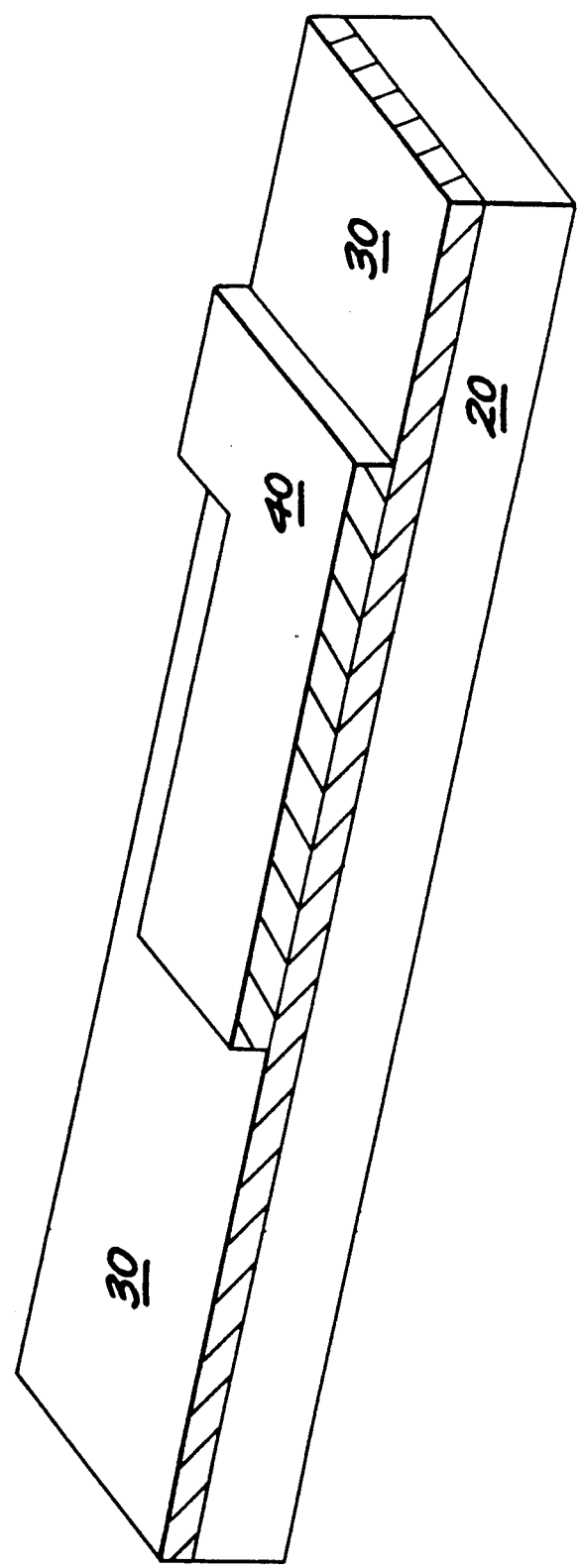
Figure 5D:
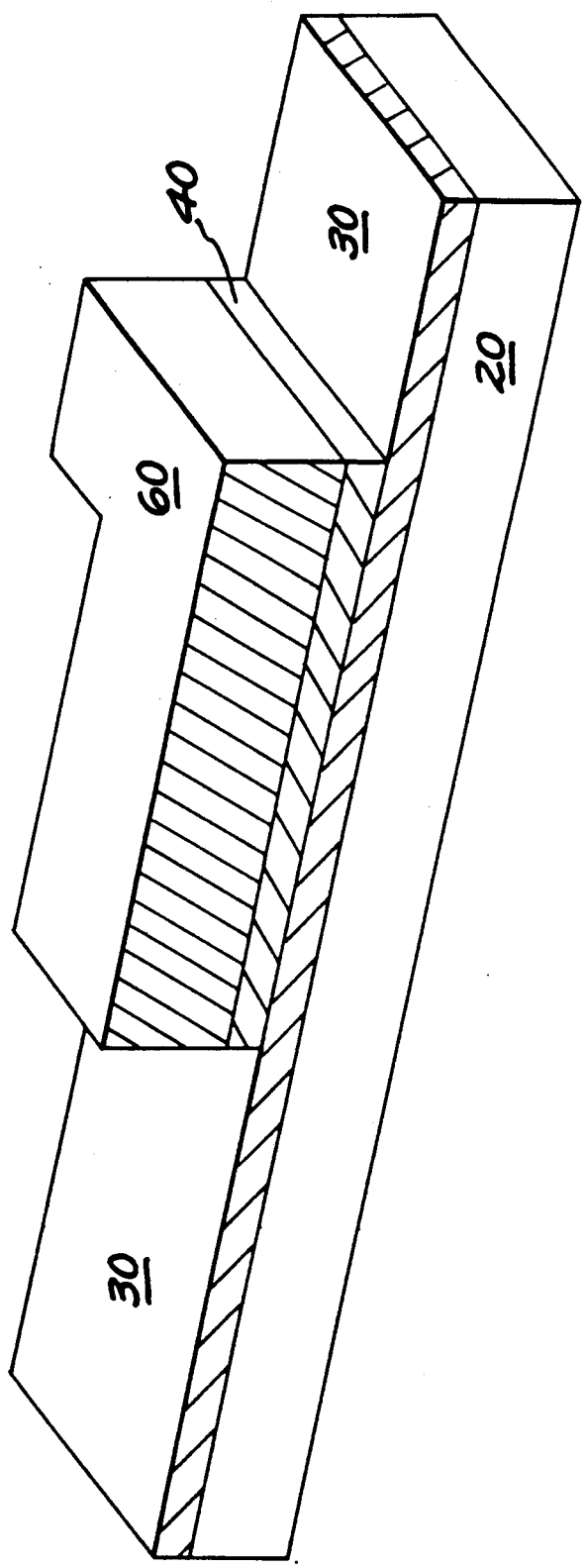
Figure 5E:
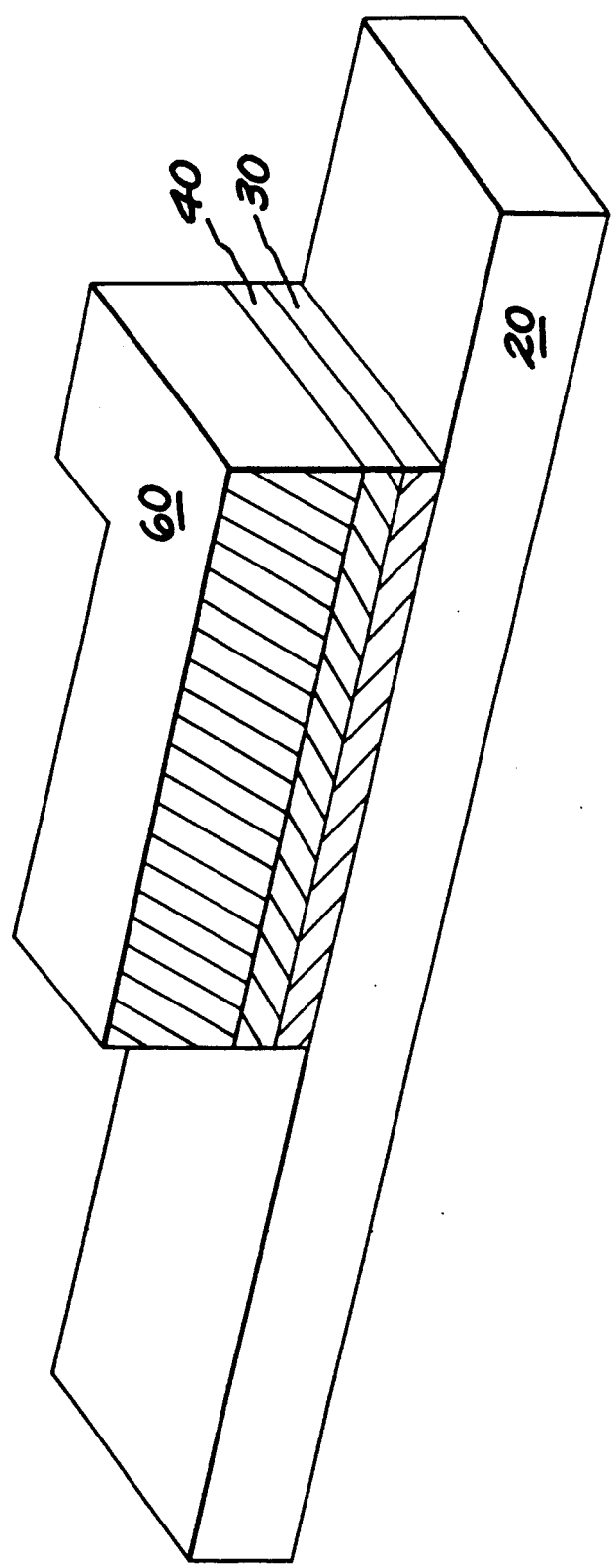

FIGS. 5A-5E illustrate an alternative process in accordance with the present invention. The underlying substrate 20 illustrated in FIG. 5A is a plain glass substrate, but could be the same as that illustrated in FIG. 4A. The initial titanium layer 30 and the copper layer 40 over that titanium layer were sputtered onto the glass substrate to provide the FIG. 5B structure. The second titanium layer of the FIG. 4 process was not provided in the FIG. 5 embodiment. Instead, the copper layer 40 was selectively etched to remove the copper layer everywhere except in the desired plating pattern to provide the structure illustrated in FIG. 5C. This selective etching of the copper was performed using photoresist and a ferric chloride copper etchant Ferric chloride is an etchant which is selective for copper and does not etch titanium. Other selective etchants may be used. As an alternative, a styrene/allyl alcohol copolymer solution (such as that available from Aldrich Chemicals) with iodoform ($CHI_3$) and toluene was formed and spin coated on the surface of copper layer 40. A preferred solution consists of 2.2 grams of styrene/allyl alcohol copolymer, 1.0 gram of iodoform and 7.8 grams of toluene. This solution was stirred so it was uniform and was spin coated on the surface of copper layer 40. After this coating dried, it was irradiated with a laser in the ultraviolet portion of the electromagnetic spectrum. Ultraviolet light could have been used instead. The incident light caused decomposition of the iodoform to produce iodine radicals which reacted with the copper to etch the copper layer. After the irradiation with the ultraviolet light, the overcoat film was dissolved in toluene. This left the desired copper plating pattern on the uniform titanium layer 30. Alternatively, chlorine gas can be used to selectively etch the copper when it is irradiated in the desired pattern. This removes the copper when a frequency doubled Nd:YAG laser operating at 532 nm or an argon ion laser operating at 355 nm is used. Other lasers or light sources operating at wavelengths in this portion of the electromagnetic spectrum may also be used. In any event, once the structure shown in FIG. 5C is produced, it is electroplated to produce the structure in FIG. 5D and is then selectively etched in a titanium etchant to produce the structure shown in FIG. 5E.

Figure 6A:
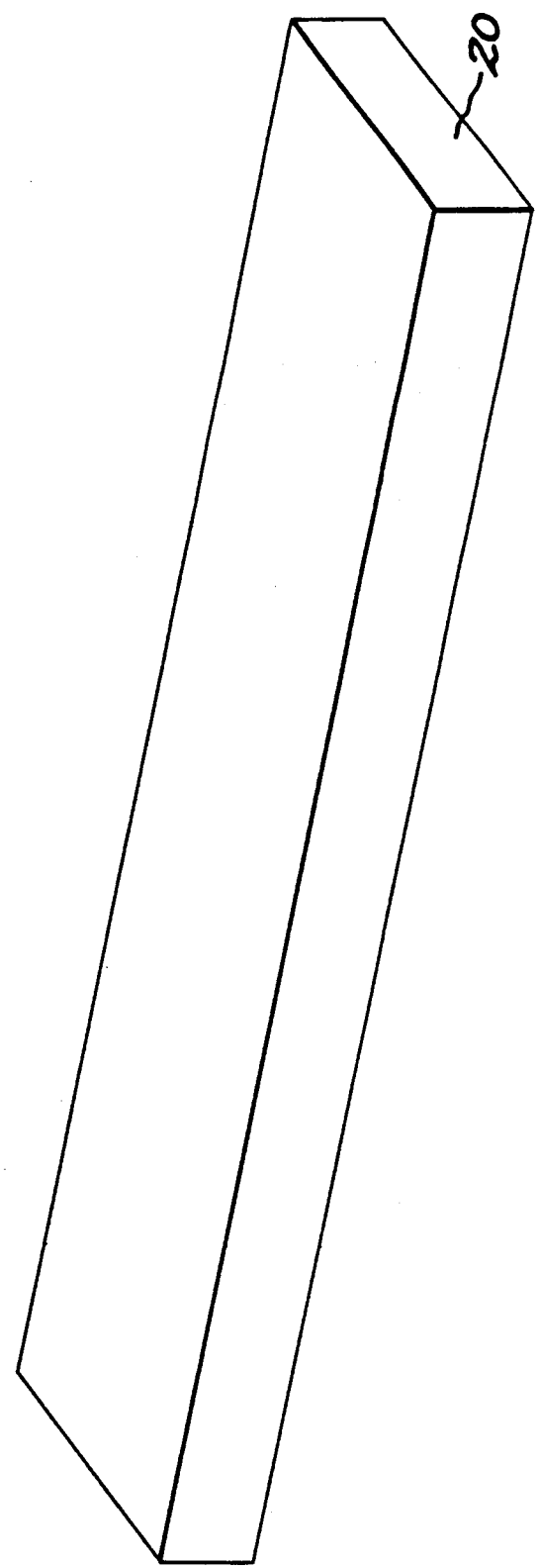
Figure 6B:
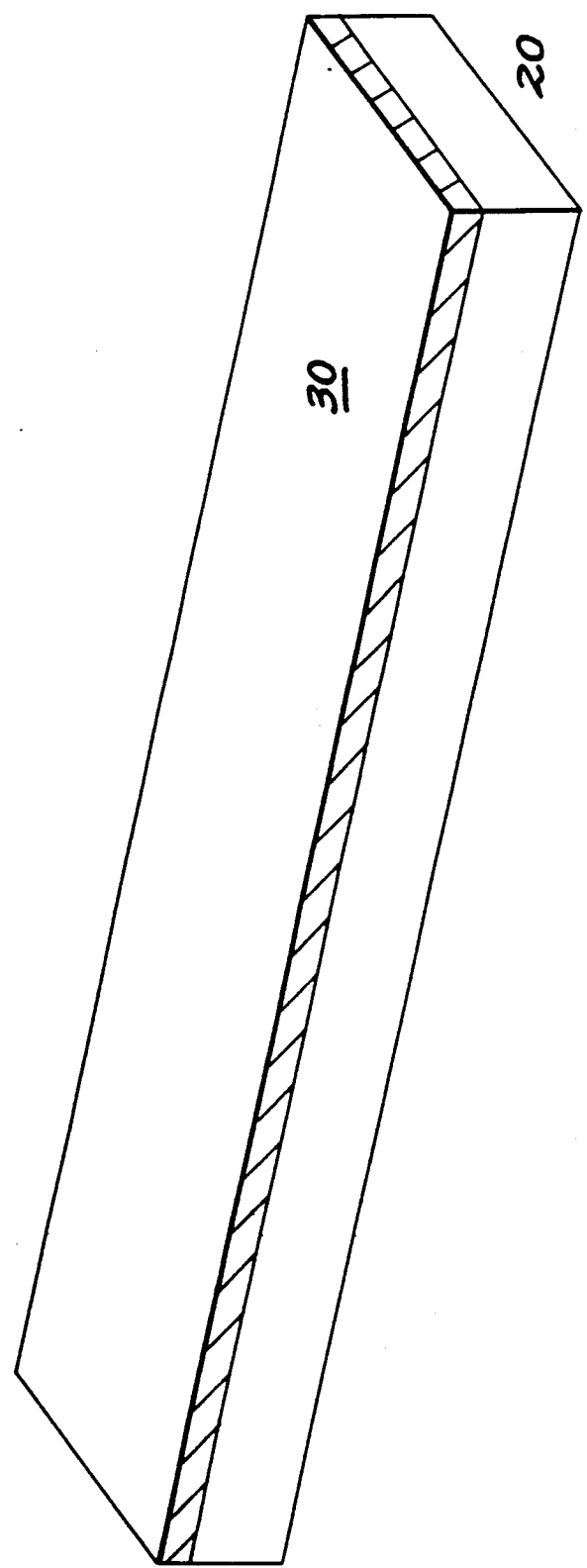
Figure 6C:
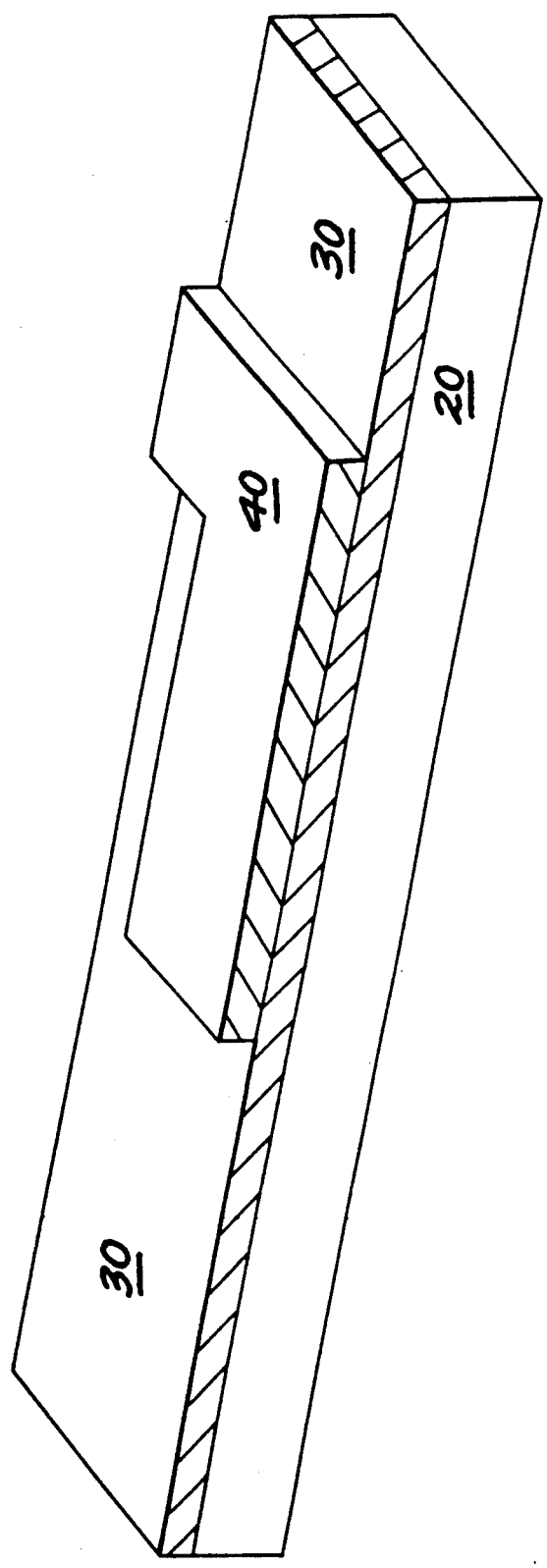
Figure 6E:
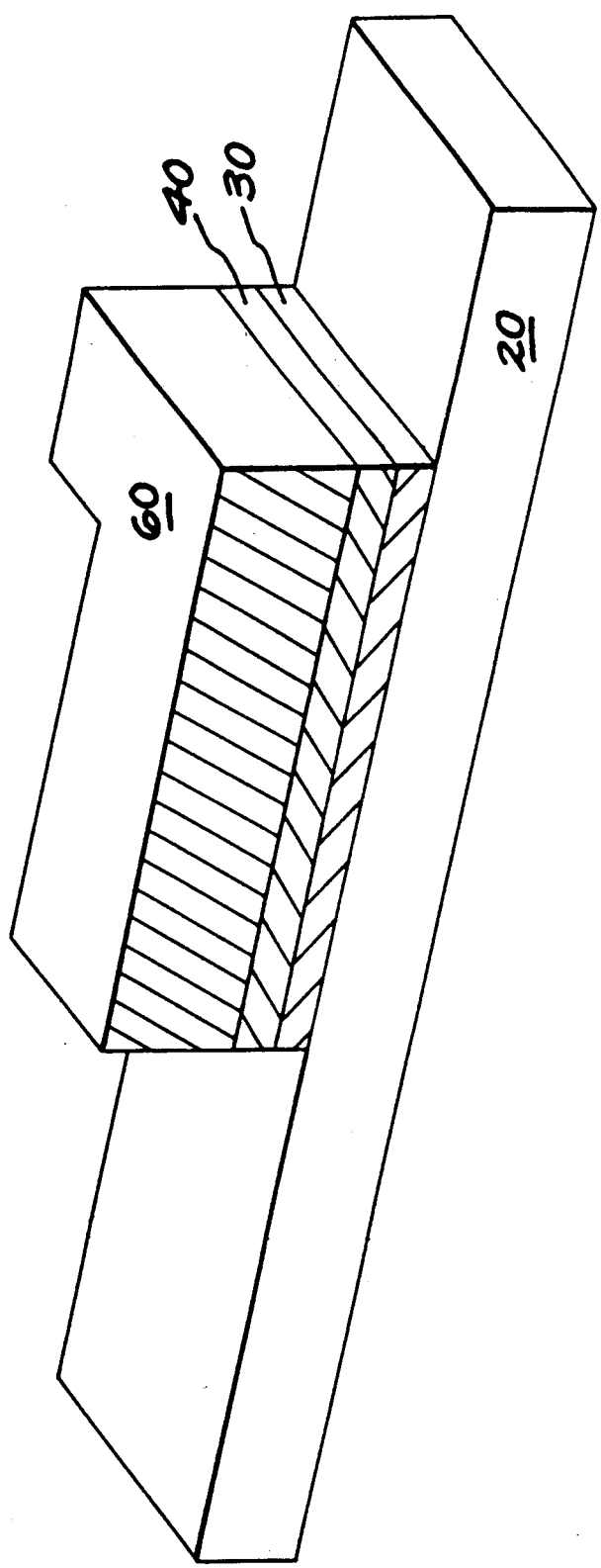

A third alternative fabrication sequence is illustrated in FIGS. 6A-6E. The initial substrate in FIG. 6A was like that in FIG. 5A. The initial titanium layer 30 was sputtered onto the upper surface of the glass to produce the structure shown in FIG. 6B. Thereafter, copper was selectively deposited on top of the titanium layer in the desired plating pattern. A number of different techniques can be used to produce this copper layer 40 (FIG. 6C). We used palladium acetate as a precursor material whose laser irradiation defines the location at which the copper is deposited. In particular, palladium acetate was spin coated onto the upper surface of the titanium film using a palladium acetate/chloroform solution. The laser then irradiated the palladium acetate in the desired plating pattern. The irradiation converted the palladium acetate to elemental palladium. Alternative palladium containing precursor materials can be used in the gas phase or as thin films. The structure was next immersed in an electroless copper plating solution and copper selectively plated on the palladium where the palladium acetate had been laser exposed. This electroless copper preferably has a thickness of 1,000-2,000 angstroms. The structure was then electroplated with copper 60 to the desired thickness as shown in FIG. 6D and the exposed titanium was selectively etched to produce the structure shown in FIG. 6E.

Figure 7A:
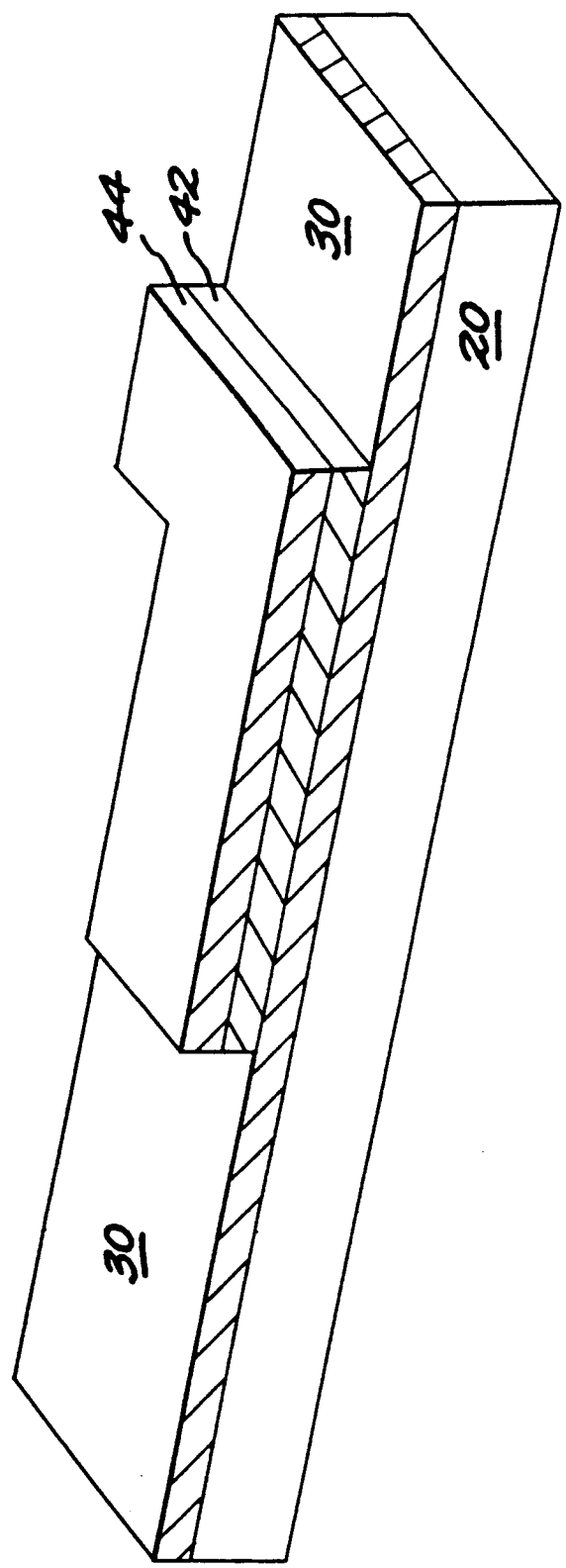
FIGS. 7A and 7B illustrate two steps which can be used in place of the step of FIG. 5D.

As a further alternative, in the embodiment illustrated in FIGS. 5A-5E, the process and structure were modified by making the second sputtered layer palladium (Pd) rather than copper. The palladium was then patterned using photoresist and a selective palladium etchant (dilute HCl) to leave the palladium only in the desired plating pattern. The resulting structure was then inserted in an electroless copper plating bath where the palladium catalyzed copper deposition only on the palladium. This resulted in the structure shown in FIG. 7A where the palladium layer is identified by the reference numeral 42 and the electroless copper is identified by the reference number 44.

Figure 7B:
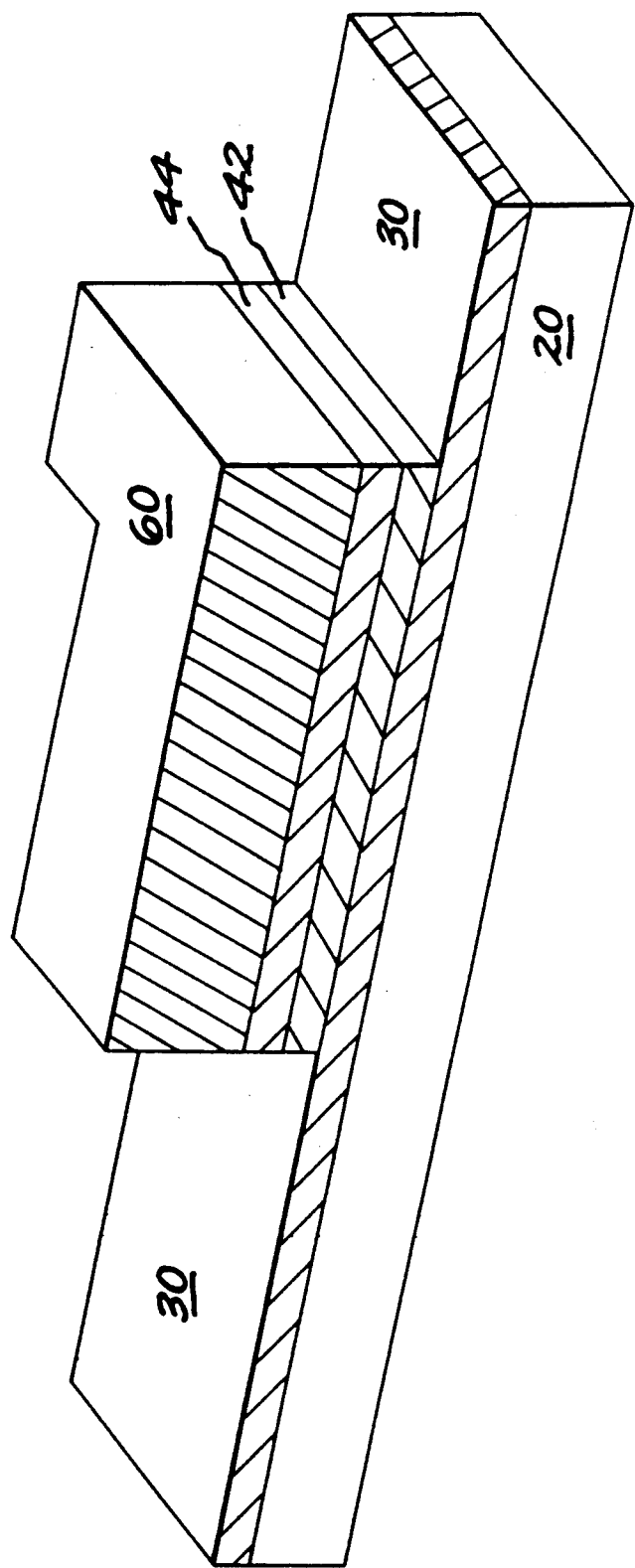

Thereafter, this body was electroplated in the manner which has been described to produce the body shown in FIG. 7B. A selective titanium etch was then used to remove the exposed titanium.

From these examples, it will be apparent that a wide variety of specific processes have been used and may be utilized to produce the body which was or is to be immersed in the electrolytic copper plating bath to produce the selectively plated thick copper. An even wider variety of processes can be used. The particular process used to produce the structure to be immersed in the electrolytic copper plating bath is unimportant from the point of view of the broad invention which is based on the presence of a surface comprised of two different metals, one of which forms a non-platable surface layer while the other does not, as a means of controlling where plating takes place However, the individual processes are important in the manner in which they control the locations in which plating is provided and the manner in which they provide adherence to the underlying structure.

FIGS. 1-3, 5 and 6 are completely general as to the type of substrate and its composition on which the selective electroplated copper is to be deposited. In contrast, FIG. 4 is more specifically directed to a substrate having a Kapton polyimide or other dielectric layer thereover with via holes in alignment with conductors on the surface of the substrate. The techniques illustrated in FIGS. 1-3, 5 and 6 are of wide applicability as is the process of FIG. 4 which is not limited to polyimide coated substrates, but is of particular interest for such polyimide coated substrates.

Figure 8A:
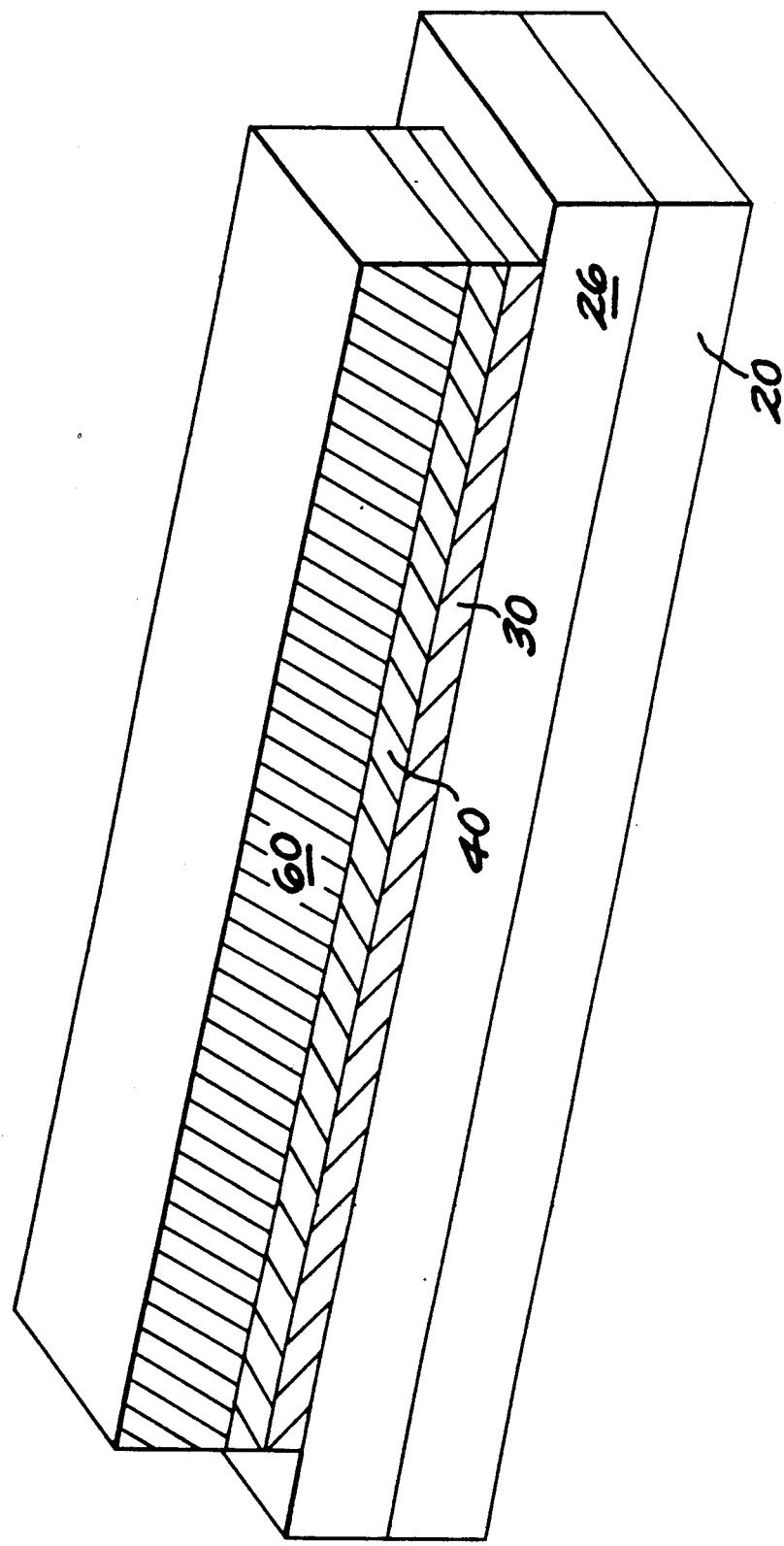
FIGS. 8A and 8B illustrate a process in which an electroplated conductor is subsequently separated into separate segments.
Figure 8B:
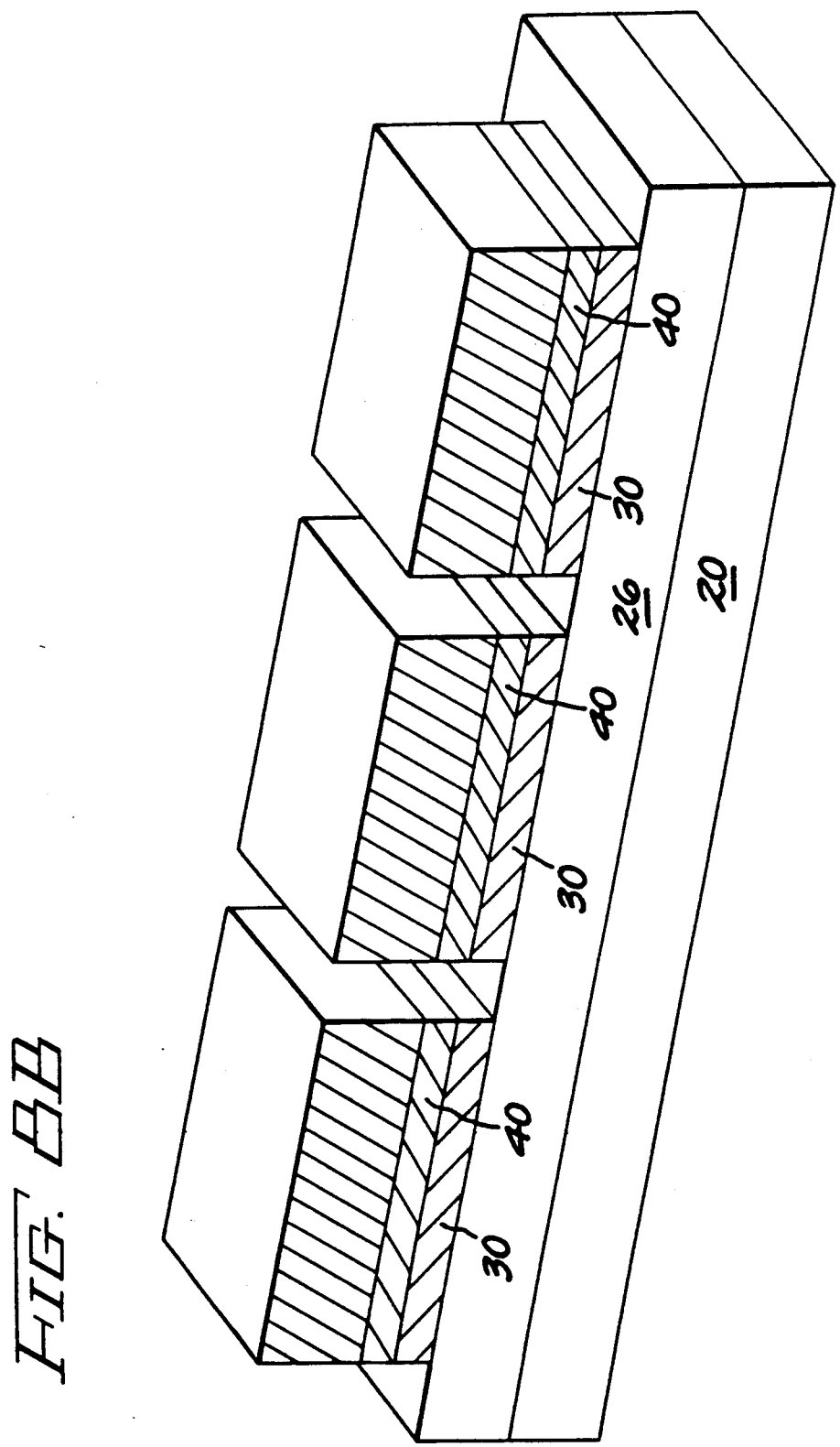

It is preferred to define the plating pattern to produce the desired final thick copper film structure directly by the plating process, however, it is also possible to define a single continuous electroplated copper conductor pattern which includes all of the segments of the final copper pattern and additional connecting segments. If that is done, then after electroplating the entire plating pattern, that plated pattern is coated with a photoresist and the photoresist is exposed in a pattern so that the photoresist protects all portions of the plated structure except the connecting segments of the continuous copper conductor which are to be removed to convert that continuous strip into isolated copper segments. This is illustrated in FIG. 8A where a continuous copper plated strip is illustrated prior to etching to separate it into isolated segments and the structure after etching is shown is FIG. 8B where the continuous strip in FIG. 8A has been converted into three isolated segments in FIG. 8B. Other separation techniques such as fuses (narrow segments which can be removed by the passage of currents which do not affect the portions to be retained) may be employed to divide a single conductor into separate segments.

Other plating baths, other etchants, and/or protective layers other than oxides may be used in accordance with the present invention without departing from its true nature and scope.

We have developed the following method as a means of testing the appropriateness of materials for use as the platable material, the non-platable material and the non-platable surface layer in various plating baths.

First, we prepare 2 inch square clean glass substrates and sputter a film of the material in question onto the substrate. These test layers are typically 1,000-2,000 Å thick. Second, for the potentially non-platable materials, we expose the resulting coated glass substrate to an environment in which the desired potentially non-platable layer forms on the surface of the conductive material. Next, we connect the cathode of the plating system to the substrate and immerse it in the electroplating bath. If uniform plating results and adhesion is adequate, then the material is appropriate for use as the conductive material on which plating takes place. If no plating occurs, the compound is appropriate for use as the protective layer on the surface of the corresponding conductive material. If a speckling of plating results, then that material is not appropriate for use as either the non-platable portion of the substrate (at least with that protective material without enhancement of its plating prevention) or the platable portion of the substrate. The table shows the results of these tests for some materials

TABLE

| Substrate Material | Material to be Plated Onto Substrate | | |
|---|---|---|---|
| | Copper | Gold | Nickel |
| Copper | good plating | good plating | good plating |
| Gold | good plating | good plating | good plating |
| Nickel | good plating | good plating | good plating |
| Titanium | no plating | good plating | good plating |
| Chromium | no plating | initial plating speckled-poor adhesion | initial plating speckled-poor adhesion |
| Aluminum | no plating | no plating sample pre-treated at 280° C. for 15 minutes in air before immersion | no plating sample pre-treated at 280° C. for 15 minutes in air before immersion |

Two different gold baths were tried—Aurall 364 at 43° C. for 5 minutes at 1 amp per square foot (ASF) and Aurall 305 at 57° for 20 minutes at 1 ASF. The results were the same for both of these baths. These baths are products of Lea Ronal and were used in accordance with their instructions. The nickel bath was Watts Nickel from Lea Ronal and was held at 55°–60° C. The parts were immersed for 5 minutes at 20 ASF. Since no plating occurred, a surface layer ($Al_2O_3$) on the aluminum must have insulated the aluminum from the bath. This surface layer was non-soluble in the bath. Thus, the bath was inert with respect to this layer.

The treatment of the aluminum samples at 280° for 15 minutes in air was because these samples had been kept in a nitrogen atmosphere dry box and thus had not had an opportunity to form a $Al_2O_3$ surface layer due to atmosphere exposure. This treatment ensured that if plating had occurred, that plating would be because the surface layer was not effective, rather than because no surface layer was present. Thus, aluminum is an appropriate material for use as the non-platable portion of the substrate for electroplating of copper, gold and nickel.

Other materials for use as the platable or non-platable portion of the substrate can be tested in this manner to determine their suitability for use with various baths. From the table, it can be seen that titanium and chromium are materials which are non-platable under the conditions for copper plating, but do not constitute a non-platable material under the process conditions for gold and nickel plating, at least with the baths we used.

As a result of the test results for aluminum in the gold and nickel baths as shown in the table, we prepared two different sets of test samples. The first set was a gold film sputtered onto a glass slide with an aluminum layer evaporated onto the gold. In the second set, a nickel layer was sputtered onto the glass and aluminum was evaporated onto the nickel. The aluminum layer was then patterned to selectively expose the underlying gold or nickel. One sample from each set was then plated in the two gold baths (5 minutes in 364 bath to provide a strike or flash layer of gold followed by 20 minutes in the 305 bath to increase the thickness of the gold layer. Good selective plating resulted both on the first set sample (Au) and the second set sample (Ni), i.e. no gold plating occurred outside the pattern defined in the aluminum layer and within the pattern full plating occurred.

Next, we inserted a sample from each set in the nickel plating bath for 5 minutes of plating at 20 ASF. Again, good selective plating resulted. Thus, the test established that effective materials for use as the non-platable portion of the body can be determined by our test procedure. The surface layer on the aluminum of these samples was formed by overnight exposure of the samples to air at room temperature. Thus, the 280° C. treatment is not essential to the formation of the non-platable surface layer.

As a further test, we sputtered gold on to an alumina ($Al_2O_3$) substrate, sputtered titanium over the gold and $SiO_2$ over the titanium. We then patterned the $SiO_2$ and the titanium to expose portions of the gold to provide a body having a conductor surface comprised of two different metals (Ti and Au) with a non-platable or protective layer over one of them. When plated in the gold bath, this sample produced mixed results in that in some regions good selective plating was obtained, while in others, there were specklings of gold plating in the $SiO_2$ areas. The speckling occurred only after the plating current density in the bath had exceeded to more than the recommended density. This established that the $SiO_2$ is capable of protecting the surface of the Ti from the gold bath. A thicker $SiO_2$ layer or better control of the plating current should prevent any speckling. In a copper bath (which is much less aggressive than the gold bath toward oxides), good selective plating should result. Thus, the appended claims are intended to cover such structures of whatever composition which provide selective electrodeposition as a result of two different conductive materials being exposed at the surface of a body with one of them forming a surface layer or protective film when exposed to a particular ambient environment while the other does not form that film material with the result that electrolytic deposition will take place on the conductive material which does not form that surface film. It will be recognized, that two different materials, both of which form surface films, may be utilized provided that in the electroplating environment or prior to insertion of the body in the electroplating environment, the surface layer is removed from the one of those materials on which electroplating is to take place. The configuration of the sidewalls of the plated pattern for such fine patterns are difficult to determine and seems to be dependent on process conditions such as age of the plating bath, percent depletion of the bath, current density and other electroplating conditions. What factors control the configuration of the sidewall is not understood.

A further advantage of this process is the fact that it is easily adapted to plating on non-flat surfaces of almost any configuration where the desired plating pattern is defined without using photoresist. Prior art photoresist processes require that the photoresist be of substantially uniform thickness in order for it to be properly exposed and developed. Such uniform thicknesses are difficult to obtain on non-flat surfaces.

While the invention has been describe in detail herein in accord with certain preferred embodiments thereof, many modifications and changes therein may be effected by those skilled in the art. Accordingly, it is intended by the appended claims to cover all such modifications and changes as fall within the true spirit and scope of the invention.

We claim:

1. A method of electroplating in accordance with a desired plating pattern, said method comprising the steps of:
   (a) providing a body having a surface which is conductive, said body comprising:
      a substrate, and
      a substantially continuous conductive structure disposed over said substrate, said conductive structure comprising first and second different conductive materials, both of which are exposed at said conductive surface of said body, said first conductive material being exposed in said desired plating pattern and said second conductive material having a native dielectric film formed thereon;
   (b) coupling an electrode to said conductive structure;
   (c) applying a plating polarity of power to said electrode; and, after step (c)
   (d) immersing at least the portion of said body to be plated in an electroplating bath for a time sufficient to form a desired thickness of electroplated material on said first conductive material without electroplating on said second conductive material.

2. The method recited in claim 1 further comprising the step of:
   forming said native dielectric film by exposing said body to air.

3. The method recited in claim 1 wherein said second conductive material is selected from the group consisting of titanium, chromium, aluminum, alloys containing titanium, chromium or aluminum and mixtures thereof.

4. The method recited in claim 3 wherein said second conductive material comprises titanium.

5. The method recited in claim 4 wherein said second conductive material is titanium.

6. The method recited in claim 3 wherein said second conductive material comprises chromium.

7. The method recited in claim 6 wherein said second conductive material is chromium.

8. The method recited in claim 3 wherein said second conductive material comprises aluminum.

9. The method recited in claim 8 wherein said second conductive material is aluminum.

* * * * *